(12) United States Patent
Brücklmayr et al.

(10) Patent No.: US 6,839,287 B2
(45) Date of Patent: Jan. 4, 2005

(54) METHOD OF STORING A QUANTITY OF DATA IN A TARGET MEMORY LOCATION AND STORAGE SYSTEM

(75) Inventors: Franz-Josef Brücklmayr, Kaufering (DE); Christian May, München (DE); Wolfgang Pockrandt, Reichertshausen (DE); Holger Sedlak, Egmating (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/653,536

(22) Filed: Sep. 2, 2003

(65) Prior Publication Data

US 2004/0076046 A1 Apr. 22, 2004

Related U.S. Application Data

(63) Continuation of application No. PCT/EP01/14348, filed on Dec. 6, 2001.

(30) Foreign Application Priority Data

Mar. 2, 2001 (DE) .......................................... 101 10 153

(51) Int. Cl.[7] .................................................. G11C 7/00
(52) U.S. Cl. ..................................... 365/189.05; 365/52
(58) Field of Search ............................. 365/189.05, 52, 365/63

(56) References Cited

U.S. PATENT DOCUMENTS

| 4,433,395 | A | | 2/1984 | Iyehara et al. |
| 4,922,456 | A | | 5/1990 | Naddor et al. |
| 5,226,168 | A | * | 7/1993 | Kobayashi et al. ............ 711/1 |
| 6,035,347 | A | | 3/2000 | Beardsley et al. |

FOREIGN PATENT DOCUMENTS

| EP | 0 489 204 A1 | 6/1992 |
| JP | 2000305862 | 11/2000 |

* cited by examiner

*Primary Examiner*—Thong Q. Le
(74) *Attorney, Agent, or Firm*—Laurence A. Greenberg; Werner H. Stemer; Gregory L. Mayback

(57) ABSTRACT

In a method of storing a quantity of data in a target memory location, the data quantity is stored first in a non-volatile buffer memory location. It is then examined whether the data are successfully stored in the non-volatile buffer memory location. If the step of examining produces a positive result, the target memory location to which the predetermined quantity of data is to be written is cleared. After the step of clearing of the target memory location, the data are transferred from the non-volatile buffer memory location to the target memory location. To conclude the storage cycle, the non-volatile buffer memory location is then cleared so as to be available for a new storage operation. The effect achieved thereby is a secure and uncomplicated transfer of information from a source memory to the target memory.

9 Claims, 2 Drawing Sheets

METHOD OF STORING A QUANTITY OF DATA IN A TARGET MEMORY LOCATION AND STORAGE SYSTEM

CROSS-REFERENCE TO RELATED APPLICATION

This application is a continuation of copending International Application No. PCT/EP01/14348, filed Dec. 6, 2001, which designated the United States and was not published in English.

FIELD OF THE INVENTION

The present invention relates to the storing of information, and in particular to the secure storing of information in an environment subject to fault-liability.

BACKGROUND OF THE INVENTION AND PRIOR ART

In non-volatile storing of information, there may occur data losses or even arbitrary changes of data. As the storing operation, usually consisting in clearing of the old information and writing of the new information, takes place over a relatively long period of time, disturbances may take place in particular, for example, in case of voltage dips in the supply of the memory chip, in the supply of bus lines or in the supply of the memory delivering the data to be stored.

If there are disturbances during the time necessary for non-volatile storing, the storage operation will not be performed correctly, and the result will be dependent on the manner in which the storage operations were carried out, or in other words, on the programming conditions and the type and time of the disturbances.

U.S. Pat. No. 4,922,456 relates to a method of reducing wearout in a non-volatile memory with double buffer. Before a write operation is performed, information to be stored is written to a double buffer in order to be able in case of a disturbance to reconstruct the steps to be performed during the write operation. A flag is set indicating that the double buffer is valid. The data from the double buffer are then written to the appropriate locations of a non-volatile memory. Finally, the flag is cleared so that the memory management system knows that it is no longer the data in the double buffer that are valid, but the data in the non-volatile memory.

Such methods, as disclosed in exemplary form in U.S. Pat. No. 4,922,456, make use of parallel memory locations in which the information is stored in alternating manner so that the initial state is retained at all times during the storing operation. The progress of the programming operation is maintained by means of flags. These flags always designate the memory location with the currently valid information. The setting on non-volatile flags in turn necessitates non-volatile programming operations that have to be secured against disturbances. The entire sequence thus is composed of quite a number of non-volatile storing operations necessitating considerable expenditure in time. Moreover, the point is reached relatively late at which the new information is present in such a form that it may be used, after elimination of a disturbance, as starting basis for a correction operation. The operation largely follows steps that have the sole function in case of a disturbance to rescue the old information. In addition thereto, the expenditure for programming the flags etc. must not be overlooked either.

EP 0 489 204 B1 discloses a data storage device, such as a disk drive or a tape drive, adapted to be reprogrammed with a new program code. At least part of the non-volatile memory of the data storage device is a flash memory, with the data management system being designed to first program a new program code in a RAM data buffer. Thereafter, it is determined whether the entire new program code has been received and stored in the data buffer. The flash memory is then cleared, whereupon the new program code is transferred from the data buffer to the flash memory.

This concept is advantageous as compared to storing using flags, in that such flags are no longer necessary. However, a problem resides in that the RAM buffer is a volatile memory so that, within the period of time in which the data are kept in the RAM buffer, a data loss may occur due to voltage variations or voltage dips at the RAM buffer. Thus, it is necessary according to EP 0 489 204 B1 before the step of transferring the new program code from the data buffer to the flash memory to carry out an additional examination step in order to find out whether or not the data have been corrupted during their time in the RAM buffer. This examination step or these examination steps in turn lead to increased expenditure and thus to an increased demand of time in storing information or, alternatively, to a RAM memory with particularly secured voltage supply, which in turn involves much time, is expensive and often is difficult to integrate in an overall system. In addition thereto, it is necessary to prepare examination algorithms for the data.

SUMMARY OF THE INVENTION

It is the object of the present invention to make available a concept for secure and uncomplicated transferring information from one storage medium to another storage medium.

In accordance with a first aspect of the invention, this object is achieved by a method of storing a quantity of data in a target memory location, comprising the steps of:

storing the data quantity in a non-volatile buffer memory location;

examining whether the data quantity is successfully stored in the non-volatile buffer memory location;

if the step of examining delivers a positive result, clearing the target memory location in which the predetermined data quantity is to be stored;

after the step of clearing the target memory location, transferring the data from the non-volatile buffer memory location to the target memory location; and clearing the non-volatile buffer memory location.

In accordance with a second aspect of the invention, this object is achieved by a storage system, comprising:

a non-volatile buffer memory location;

a target memory location; and a control means designed to carry out the following steps:

storing the data quantity in a non-volatile buffer memory location;

examining whether the data quantity is successfully stored in the non-volatile buffer memory location;

if the step of examining produces a positive result, clearing the target memory location into which the predetermined data quantity is to be written;

subsequent to the step of clearing the target memory location, transferring the data from the non-volatile buffer memory location to the target memory location; and clearing the non-volatile buffer memory location.

The present invention is based on the realization that the buffer does not have to be implemented as a non-volatile buffer to make sure that the data stored in the buffer are not corrupted during the "intermediate storage" thereof. According to the invention, the quantity of data to be transferred is stored first in a non-volatile buffer memory location. Thereafter, it is examined whether the data have been stored successfully in the non-volatile buffer memory location. Only if the examination step produces a positive result will the target memory location for storing the predetermined quantity of data be cleared. This means that the old data are cleared only after it has been ensured that the new data have arrived in the non-volatile buffer without corruption thereof. Power failure will at no place cause total data loss, since both the old data, which are stored in the target memory location, and the new data, which are stored in the buffer, are secured against power failures. The old data are cleared only after the new data have arrived in the buffer.

After the step of clearing the target memory location, the data are then transferred from the non-volatile buffer memory location to the target memory location. The new data then are available in the target memory location, and are available for a party interested therein. According to the invention, however, the non-volatile buffer memory location is cleared now at the end of the cycle.

With non-volatile buffer memories, clearing of the data takes a considerable amount of time. Due to the fact that, according to the invention, such clearing is carried out at the end of a storage cycle, the time necessary therefor does not make itself felt since the data to be stored are already present in the target memory location. On the other hand, clearing of the non-volatile buffer memory location may be utilized for obtaining quality control of the entire storage operation so to speak automatically and without additional expenditure. A completely cleared buffer memory location indicates successful termination of a storage operation, whereas a situation in which the buffer memory location is not completely cleared, indicates that problems have occurred and that, possibly, the storage operation will have to be repeated once more.

Therefore, before data are stored again in the non-volatile buffer memory location in a subsequent cycle, an examination preferably is made to the effect whether the buffer memory location is empty or whether the buffer memory location contains data that actually should not be there, so that no subsequent storage operations can be carried out if the preceding storage operation has not been concluded correctly with a completely cleared buffer memory location.

An advantage of the present invention consists in that the entire storage cycle may be reconstructed fully at any time. The data in the target memory location are cleared only after the data have been stored in the buffer memory location that is non-volatile and thus is not vulnerable. If, in contrast thereto, storing in the non-volatile buffer memory location is not carried out successfully, this is recognized by the examination, and storing of the data in the non-volatile buffer memory location may simply be repeated. Thus, quality control is carried out already at an early stage of the storage cycle, and this is the sole necessary quality control since, if the target memory location is a non-volatile memory as well, all data of interest, as of this time, are present in non-volatile memories only and thus are secured. No programming of flags and no further securing measures of the non-volatile flags are necessary. In addition thereto, it is not necessary to carry out an examination before the data are transferred from the buffer memory location to the target memory location, since the buffer memory is a non-volatile memory and thus is immune to voltage dips.

It is of course possible to carry out an examination before the data from the buffer memory are stored in the target memory, if necessary. However, this examination involves less expenditure and may be performed in sample manner for example, so as to be able to assess the quality of the non-volatile buffer memory location in addition. However, according to the invention, such examinations may be carried out with considerably less expenditure and less often since the data integrity does not need to be examined so thoroughly as in the case in which the buffer is implemented as a volatile memory.

An additional advantage of the present invention consists in that, merely by sequentially performing the various operations, a storage operation is created which is secure on the one hand and on the other hand does not need non-volatile flags involving programming expenditure. In particular, by examining whether the non-volatile buffer memory location is cleared, automatic quality control of the entire storage cycle is achieved that does not make itself felt in terms of time as the data are available in the target memory location already prior thereto. According to the invention, the data stored in the target memory location are thus already available before the complete storage cycle is concluded by clearing of the non-volatile buffer memory location.

BRIEF DESCRIPTION OF THE DRAWINGS

Preferred embodiments of the present invention will be elucidated in detail hereinafter with reference to the accompanying drawings, wherein.

DETAILED DESCRIPTION OF PREFERRED EMBODIMENTS

Figure 1:
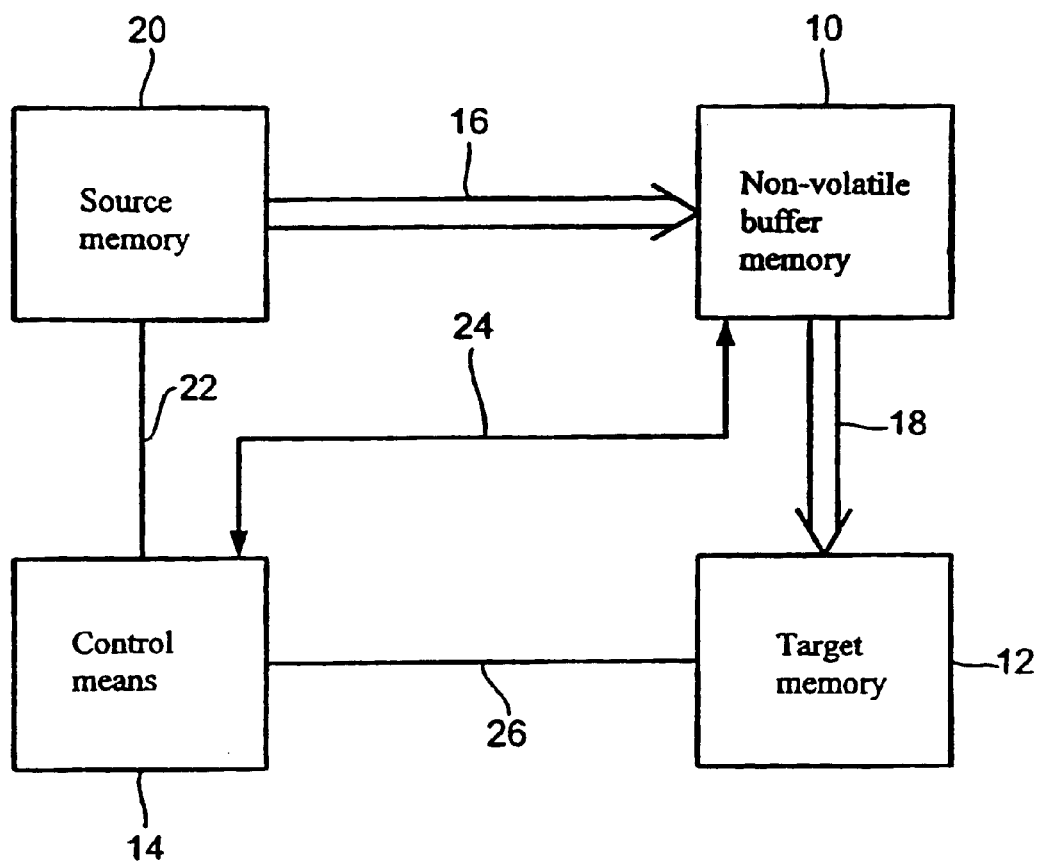
FIG. 1 shows a block diagram of a storage system according to the invention.

FIG. 1 illustrates a storage system according to the invention comprising a non-volatile buffer memory 10, a target memory 12 and a control means 14. Non-volatile buffer memory 10 may be fed with data from a source memory via a data bus 16. In addition thereto, there is a further data bus 18 present between non-volatile buffer memory 10 and target memory 12. For the present invention, however, there will be no data bus present directly between a source memory 20 and the target memory 12. However, it is to be pointed out that, for storage operations in which security is not that important, data may also be transferred directly from source memory 20 to target memory 12, for example in a fast storing mode involving compromises as to security.

Control means 14 is connected furthermore via control lines 22, 24 and 26 to the source memory 20, the non-volatile buffer memory 10 and the target memory 12, respectively, e.g. for providing for the possibilities of performing addressing operations, carrying out examinations in the non-volatile buffer memory 10 or e.g. obtaining simple return information on specific operations.

Figure 2:
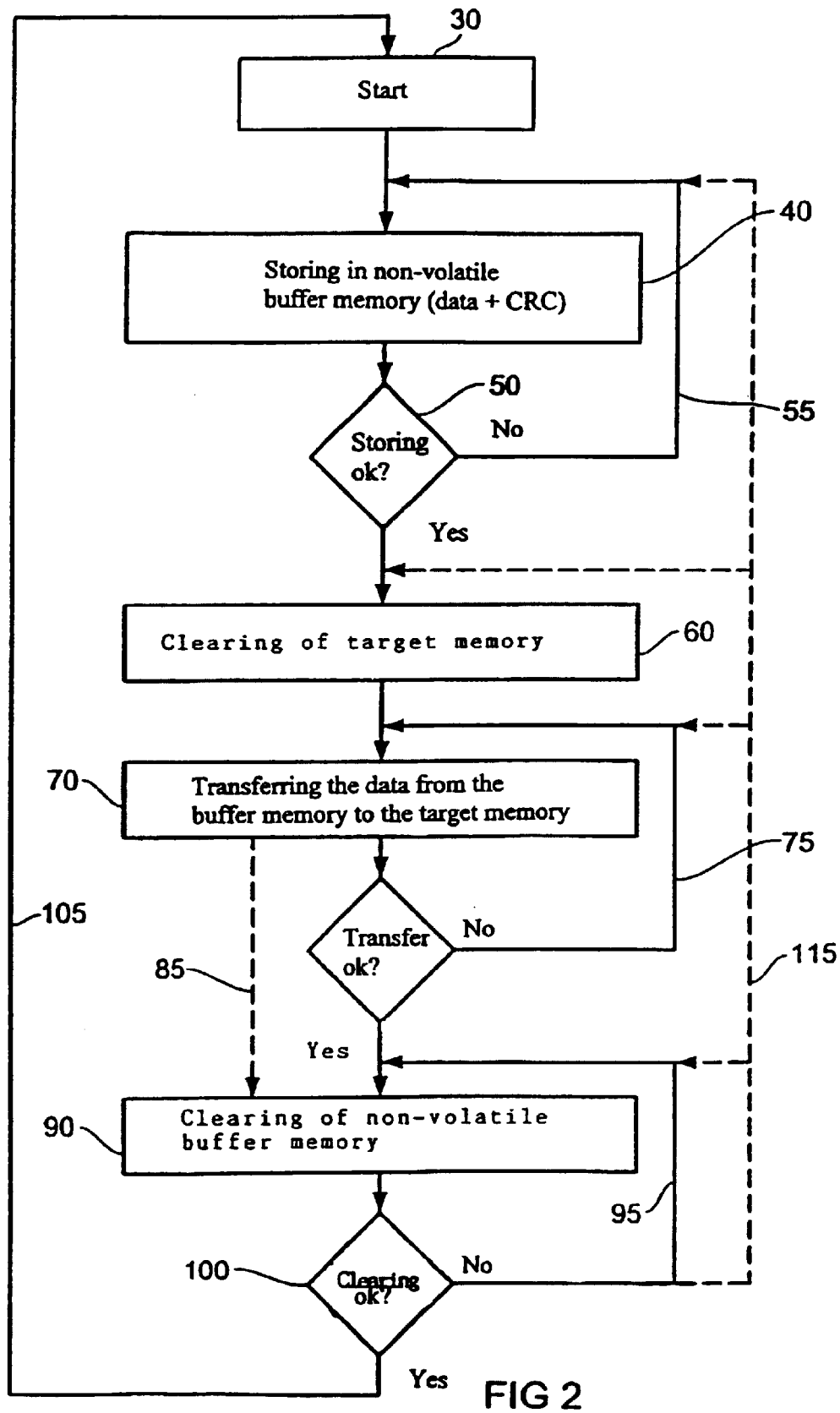
FIG. 2 shows a flow chart of a method according to the invention for storing a quantity of data in a target memory location according to the present invention.

FIG. 2 shows a flow chart performed by the control means 14 according to the present invention in order to transfer a quantity of data from source memory 20 to target memory 12. After a start block 30, the data quantity is fed first to the non-volatile buffer memory 10 (40). Thereafter, it is examined in a decision block 50 whether or not storing was OK. If storing was not okay, i.e. if a problem occurred during storing or at any other point, the sequence follows a loop 55 in order to repeat the storing operation (block 40). If in contrast thereto it is determined in block 50 that storing in the non-volatile buffer memory was OK, the sequence jumps to a block 60 in which control means 14 clears the target memory location into which the data to be stored are to be written, which data are meanwhile located in the non-volatile buffer memory 10 (FIG. 1). Thereafter, the data are transferred from the buffer memory to the target memory (block 70). In a block 80, it may be determined optionally whether this transfer was OK. If this question is answered in the negative, step 70 is repeated by way of a loop 75. If, in contrast thereto, it is determined that the transfer was OK, the sequence jumps to a block 90 in which the non-volatile buffer memory is cleared. As was already elucidated, it is possible alternatively to proceed from block 70 to block 90 directly, as indicated by an arrow 85 in broken lines, which is possible without great risk in so far as the buffer memory is a non-volatile memory.

With the conclusion of block 90, one storage cycle is completed. Either subsequent to the storage cycle or before execution of a new storage cycle only, it may be examined in a block 100 whether or not the non-volatile buffer memory location (10 in FIG. 1) is cleared completely. If this question is answered in the affirmative, the sequence can jump via a loop 105 to start block 30 in order to begin storing of a new quantity of data since the "old" quantity of data has been stored successfully in the target memory which preferably is a non-volatile memory. If, in contrast thereto, the question in block 100 is answered in the negative, clearing of the non-volatile buffer memory may be repeated once more via a loop 95. This procedure makes sense if the examination via block 80 has been carried out.

If this examination was not carried out, it is possible via optional loops, shown in broken lines 115 in FIG. 2, to jump back to any other block in order to eliminate possible errors in the storage cycle. While jumping back to block 40 is not absolutely necessary as it has already been ascertained in block 50 whether storing in the target memory location was OK, it is advisable here for the sequence to jump back to block 60 or block 70. The examination in block 100, i.e. whether the non-volatile buffer memory 10 is cleared completely and is available for a new data transfer, thus delivers an overall quality control for the storage cycle automatically and without additional flags and the like. In the light of efficiency it may thus indeed make sense to repeat the entire storage operation once more for reasons of security and to jump back to step 40 instead of reconstructing the exact point where an error has occurred.

According to the invention, the information to be transferred is deposited in non-volatile buffer memory 10 (FIG. 1), with each item of information having a specific memory location associated therewith in target memory 12. This association, according to the invention, can be stored in non-volatile buffer memory 10 directly by way of additional information associated with the data quantity, so that the control means 14 proper need not contain a table indicating where the data from source memory 20 are to be stored in target memory 12. Upon start of a storage operation, a string fully characterizing the information to be stored thus is preferably stored in the non-volatile buffer memory in non-volatile manner. This string usually contains the data proper, the address under which the same are to be stored, the number of bytes as well as a check sum, for example in the form of a CRC (CRC=cyclic redundancy check) on the information content of the string. The step of examining whether the data have been successfully stored in the non-volatile buffer memory location may be carried out, if a CRC is stored as well, simply by calculating the check sum from the data stored in the buffer memory location and by comparing the same to the check sum stored as well. If both check sums are identical, it may be presumed that the data have arrived correctly in the non-volatile buffer memory.

The target memory 12 is then cleared, whereupon the information of the buffer memory is written to the target memory. As an alternative, the additional data may be written to the target memory as well in order to carry out a new examination. However, this is not absolutely necessary as no data losses are to be expected in the buffer memory since the same is a non-volatile memory and, thus, secure conditions may be presumed once the data have arrived correctly in the non-volatile buffer memory.

Finally, the non-volatile buffer memory 10 is cleared. The programming operations in this regard preferably take place sequentially, with each next programming operation being started only after the preceding one has been concluded completely and successfully. The storing operation according to the invention thus consists in total of four operations to be programmed and an examination, as compared to the two operations that would be necessary for a storing operation without protective measures. However, the expenditure according to the invention still is considerably lower than if, for example, programming operations of flags are necessary.

The procedure according to the invention is advantageous in so far as the storage operation at all times may be reconstructed completely once just the first programming, i.e. the transfer of the data from the source memory to the non-volatile buffer memory, is successfully concluded. If the same cannot be successfully concluded, the old information definitely is available without the risk of impairment, as the target memory location 12 has not yet been touched upon.

As the storage cycle according to the invention is concluded at all times with clearing of the buffer memory 10, a value of the buffer memory deviating from the cleared state signals at all times a non-successful storage operation. As was already pointed out with reference to FIG. 2, software or firmware possibly provided in control means 14 (FIG. 1) may take the necessary steps for correctly finishing the corrupted operation or for completely repeating the same. In detail, this means the following. If storing is begun without knowledge of the previous history, e.g. after a voltage drop, or at the beginning of a storage task, it is preferred, prior to the step of storing (40) in a non-volatile buffer memory location, to carry out an examination (100) to the effect whether the non-volatile buffer memory location (10) has been cleared completely.

If this is not so, it is examined (50) by way of the CRC of the data still present in the buffer memory location whether a data quantity is successfully stored in the non-volatile buffer memory location. If this is confirmed, e.g. by conformity of the CRC with the data, the storage routine is continued with the step of clearing (60) the target memory location, as illustrated in FIG. 2. However, if it is determined that the data in the buffer memory location do not match the CRC, i.e. are apparently corrupted or do no make sense, a completely new storage cycle is begun in that the not sensible data in the buffer memory location are first cleared and the routine then jumps to the block start 30 in FIG. 2 or to block 40 in FIG. 2.

What is claimed is:

1. A method of storing a new data quantity in a target memory location having stored an old data quantity, comprising the steps of:

storing the new data quantity in a non-volatile buffer memory location;

examining whether the new data quantity is successfully stored in the non-volatile buffer memory location;

when the step of examining delivers a positive result, the positive result indicating that the new data quantity is successfully stored in the non-volatile buffer memory location, clearing the old data quantity from the target memory location in which the new data quantity is to stored;

after the step of clearing the old data quantity from the target memory location, transferring the new data quantity from the non-volatile buffer memory location to the target memory location; and clearing the new data quantity from the non-volatile buffer memory location.

2. The method according to claim 1, wherein the step of storing comprises storing of a data set in the non-volatile buffer memory location, said data set comprising a check code by means of which the integrity of the data is examined in said step of examining.

3. The method according to claim 1, wherein the step of storing comprises storing of a data set in the non-volatile buffer memory location, said data set comprising size information on the data quantity used in said step of transferring, in order to allocate a sufficiently large target memory location.

4. The method according to claim 1, wherein the step of storing comprises storing of a data set in the non-volatile buffer memory location, said data set comprising target address information that is utilized in said step of transferring for storing the data at a predetermined point of said target memory location.

5. The method according to claim 1, further comprising the following steps:

prior to said step of storing in the non-volatile buffer memory location, examining whether the non-volatile buffer memory location is cleared completely and, if this is not the case, examining whether the data quantity is successfully stored in the non-volatile buffer memory location and, if this is the case, continuing with said step of clearing the target memory location and, if this is not the case, clearing the non-volatile buffer memory location and continuing with said step of storing.

6. The method according to claim 1, wherein, prior to said step of storing, it is examined whether the non-volatile buffer memory location is cleared, and wherein said step of storing is carried out only if the non-volatile buffer memory location is cleared completely.

7. The method according to claim 1, wherein the step of transferring is followed by the following step:

examining whether the data have been successfully transferred from the non-volatile buffer memory location to the target memory location in said step of transferring, and wherein the step of clearing the non-volatile buffer memory location is carried out only after the step of transferring has been successful.

8. The method according to claim 5, further comprising the following steps:

examining whether the data have been successfully transferred from the non-volatile buffer memory location to the target memory location in said step of transferring, and wherein the step of clearing the non-volatile buffer memory location is carried out only if the step of examining was successful, and wherein the step of clearing the target memory location and the step of transferring the data from the buffer memory location to the target memory location are carried out only if the step of examining was not successful.

9. A storage system for storing a new data quantity in a target memory location having stored an old data quantity, comprising:

a non-volatile buffer having non-volatile buffer memory location;

a target memory having the target memory location; and a controller designed to carry out the following steps:

storing the new data quantity in the non-volatile buffer memory location;

examining whether the new data quantity is successfully stored in the non-volatile buffer memory location;

when the step of examining produces a positive result, the positive result indicating that the new data quantity is successfully stored in the non-volatile buffer memory location, clearing the old data quantity from the target memory location into which the new data quantity is to be written;

subsequent to the step of clearing the old data quantity from the target memory location, transferring the new data quantity from the non-volatile buffer memory location to the target memory location; and clearing the new data quantity from the non-volatile buffer memory location.

* * * * *